(12) United States Patent
Matthias et al.

(10) Patent No.: US 10,141,196 B2
(45) Date of Patent: Nov. 27, 2018

(54) POWER SEMICONDUCTOR DEVICE WITH THICK TOP-METAL-DESIGN AND METHOD FOR MANUFACTURING SUCH POWER SEMICONDUCTOR DEVICE

(71) Applicant: ABB Schweiz AG, Baden (CH)

(72) Inventors: Sven Matthias, Lenzburg (CH); Charalampos Papadopoulos, Lenzburg (CH); Chiara Corvasce, Bergdietikon (CH); Arnost Kopta, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/714,094

(22) Filed: Sep. 25, 2017

(65) Prior Publication Data
US 2018/0012773 A1  Jan. 11, 2018

Related U.S. Application Data

(63) Continuation of application No. PCT/EP2016/058057, filed on Apr. 13, 2016.

(30) Foreign Application Priority Data

Apr. 24, 2015  (EP) .................................... 15164955

(51) Int. Cl.
*H01L 21/00* (2006.01)
*H01L 21/3213* (2006.01)
(Continued)

(52) U.S. Cl.
CPC .... *H01L 21/32131* (2013.01); *H01L 29/0619* (2013.01); *H01L 29/0661* (2013.01);
(Continued)

(58) Field of Classification Search
CPC ............. H01L 21/32131; H01L 29/402; H01L 29/0661; H01L 29/41708; H01L 29/66348; H01L 29/7397; H01L 29/0619
(Continued)

(56) References Cited

U.S. PATENT DOCUMENTS 7,122,447 B2 * 10/2006 Abe ................... H01L 21/67092
438/460
7,335,574 B2 * 2/2008 Okuda ................ H01L 21/6835
257/E21.237
(Continued)

FOREIGN PATENT DOCUMENTS

| EP | 2747142 A1 | 6/2014 |
|---|---|---|
| JP | 2003249654 A | 9/2003 |
| WO | 2015025625 A1 | 2/2015 |

OTHER PUBLICATIONS

European Patent Office, International Search Report & Written Opinion issued in corresponding Application No. PCT/EP2016/058057, dated Jun. 22, 2016, 11 pp.

*Primary Examiner* — Vu A Vu
(74) *Attorney, Agent, or Firm* — J. Bruce Schelkopf; Taft Stettinius & Hollister LLP

(57) ABSTRACT

The present application contemplates a method for manufacturing a power semiconductor device. The method comprises: providing a wafer of a first conductivity type, the wafer having a first main side and a second main side opposite to the first main side, and the wafer including an active cell area, which extends from the first main side to the second main side, in a central part of the wafer and a termination area surrounding the active cell area in an orthogonal projection onto a plane parallel to the first main side; forming a metallization layer on the first main side to electrically contact the wafer in the active cell area, wherein the surface of the metallization layer, which faces away from
(Continued)

the wafer, defines a first plane parallel to the first main side; forming an isolation layer on the first main side in the termination area, wherein the surface of the isolation layer facing away from the wafer defines a second plane parallel to the first main side; after the step of forming the metallization layer and after the step of forming the isolation layer, mounting the wafer with its first main side to a flat surface of a chuck; and thereafter thinning the wafer from its second main side by grinding while pressing the second main side of the wafer onto a grinding wheel by applying a pressure between the chuck and the grinding wheel, wherein the first plane is further away from the wafer than a third plane, which is parallel to the second plane and arranged at a distance of 1 µm from the second plane in a direction towards the wafer.

20 Claims, 6 Drawing Sheets

(51) Int. Cl.
    *H01L 29/739* (2006.01)
    *H01L 29/66* (2006.01)
    *H01L 29/06* (2006.01)
    *H01L 29/417* (2006.01)
    *H01L 29/40* (2006.01)

(52) U.S. Cl.
    CPC ...... *H01L 29/402* (2013.01); *H01L 29/41708* (2013.01); *H01L 29/66348* (2013.01); *H01L 29/7397* (2013.01)

(58) Field of Classification Search
    USPC .......................................................... 438/106
    See application file for complete search history.

(56) References Cited

U.S. PATENT DOCUMENTS

| | | | |
|---|---|---|---|
| 8,039,276 B2* | 10/2011 | Amada | H01L 21/3083 257/E21.599 |
| 2005/0233499 A1 | 10/2005 | Okuda et al. | |
| 2011/0254071 A1* | 10/2011 | Hsieh | H01L 21/82348 257/315 |
| 2014/0361312 A1 | 12/2014 | Yoshikawa et al. | |
| 2015/0060938 A1 | 3/2015 | Lu | |
| 2016/0005843 A1* | 1/2016 | Hirabayashi | H01L 29/66348 257/526 |

* cited by examiner

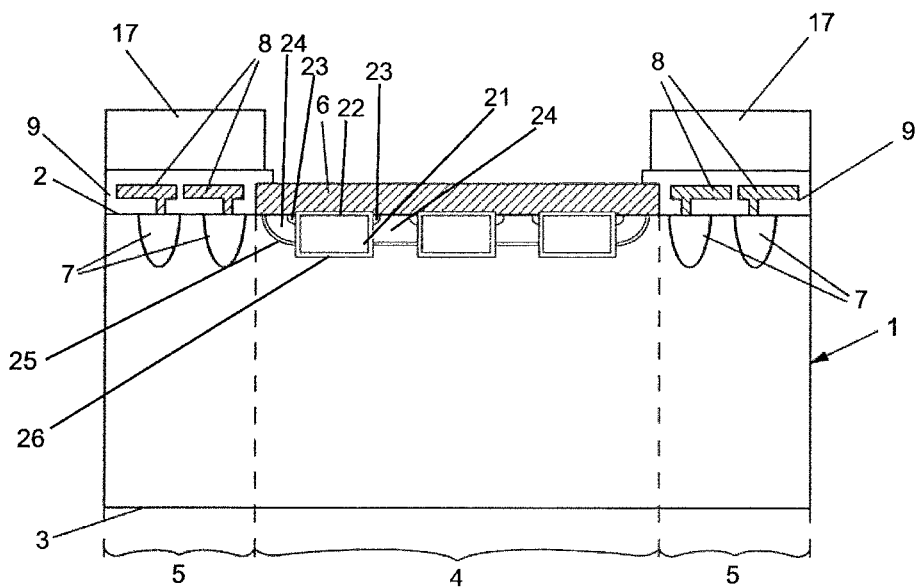
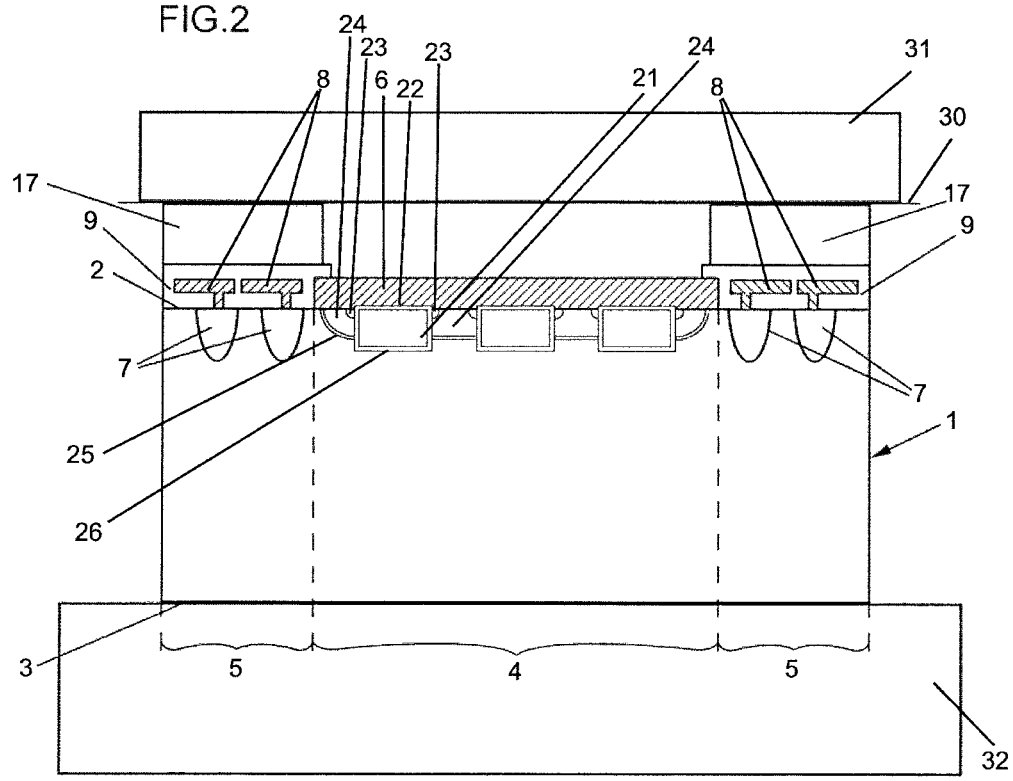

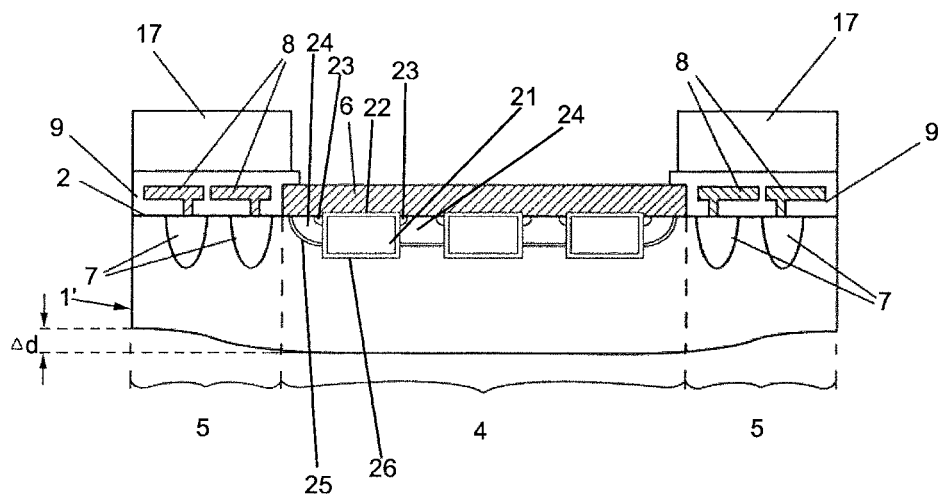
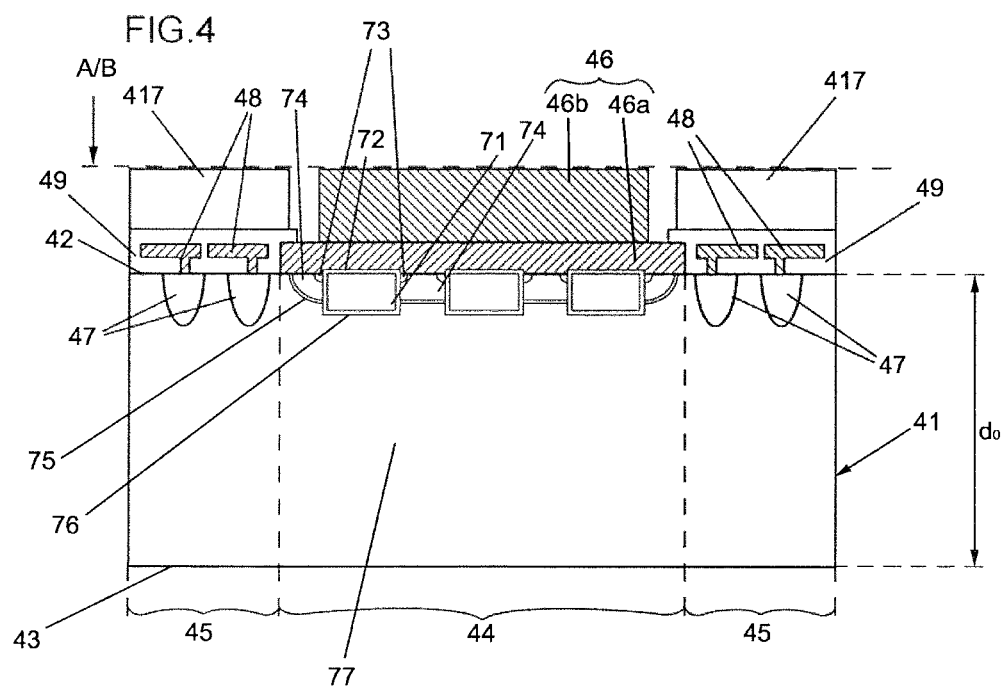

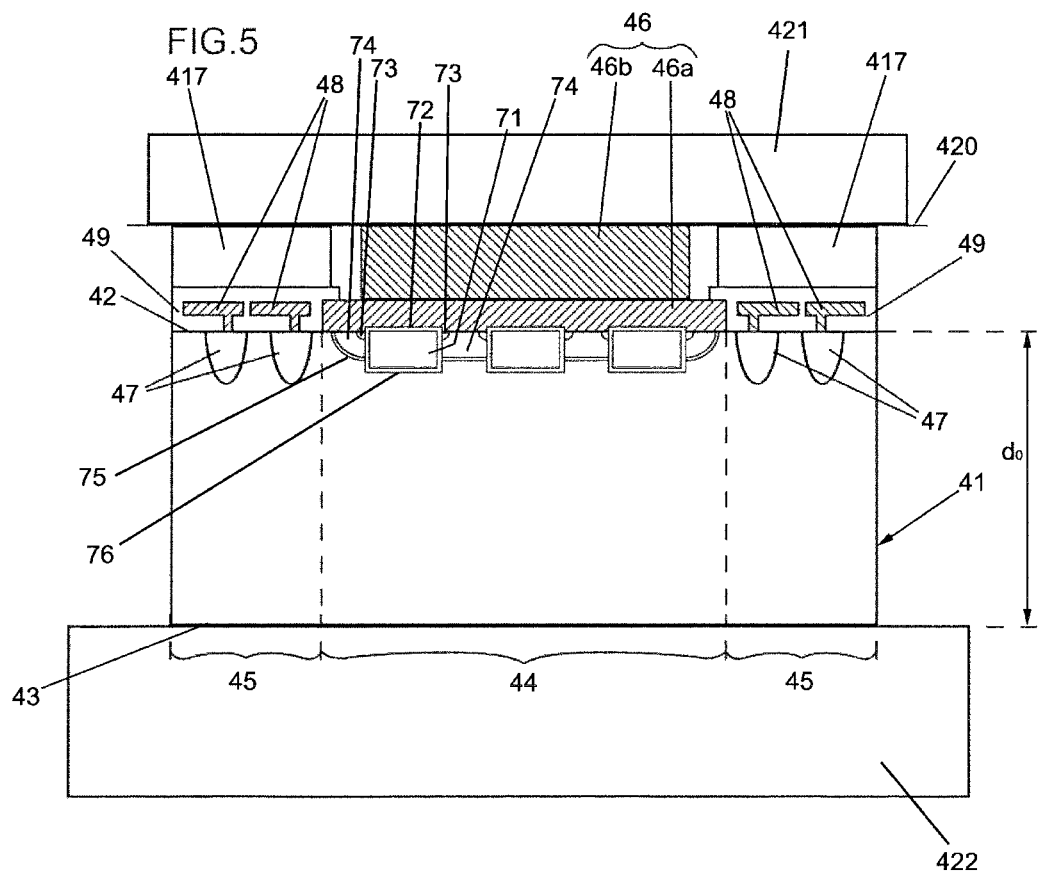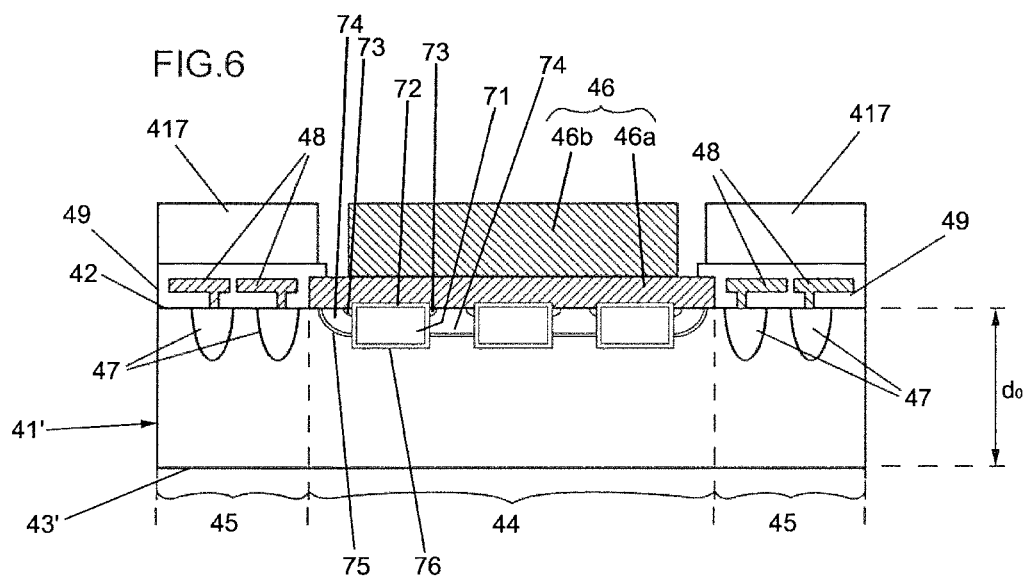

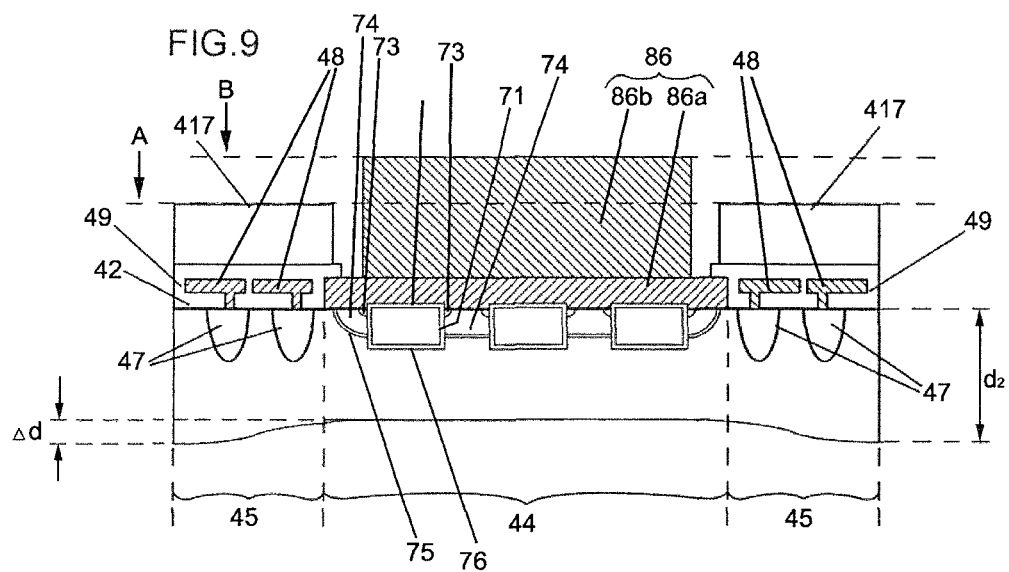
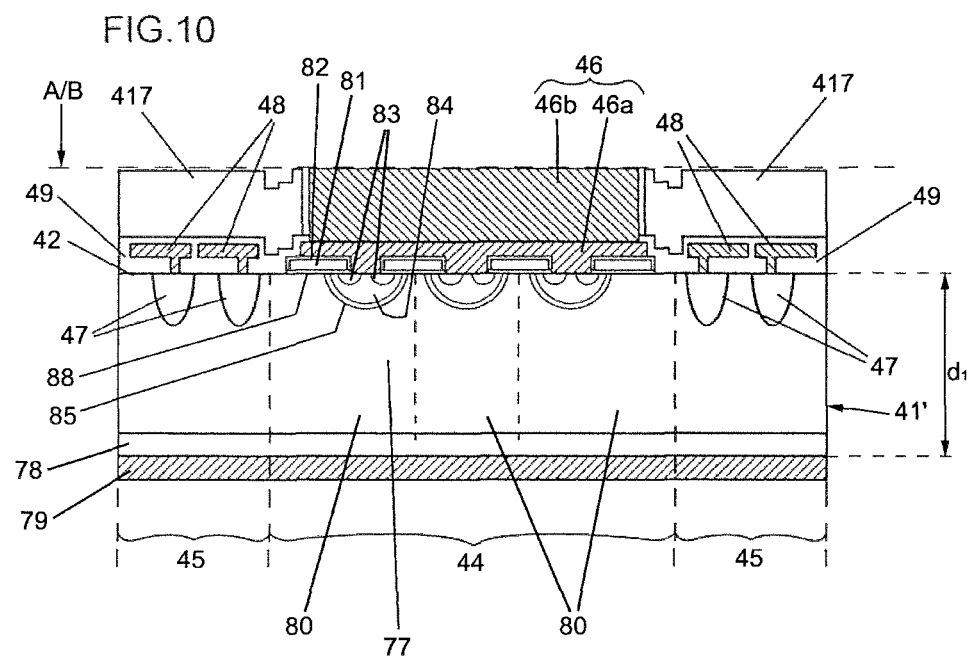

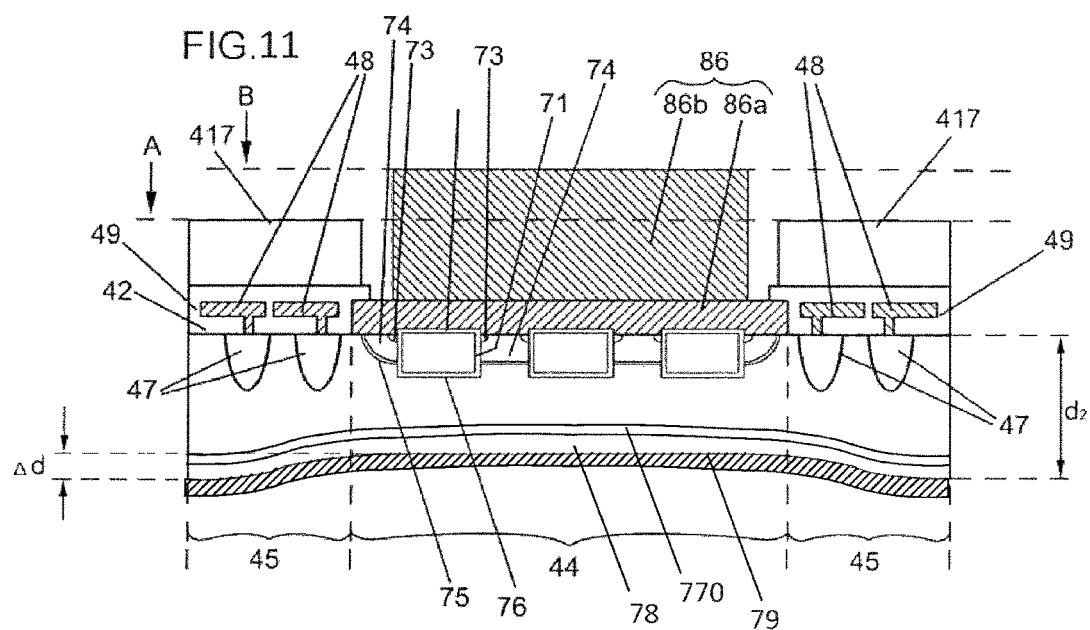

POWER SEMICONDUCTOR DEVICE WITH THICK TOP-METAL-DESIGN AND METHOD FOR MANUFACTURING SUCH POWER SEMICONDUCTOR DEVICE

FIELD OF THE INVENTION

The present invention relates to a method for manufacturing a power semiconductor device according to the preamble of claim 1.

BACKGROUND OF THE INVENTION

From document US 2015/0060938 A1 there is known a method for manufacturing a power semiconductor device. The method comprises the step of providing an n-type semiconductor wafer. An edge termination structure portion is provided in a chip outer peripheral portion of regions of the n-type wafer, surrounding an active region inside a chip inner portion. In the edge termination structure an interlayer dielectric layer is formed for isolating floating field plates in the edge termination structure on a front side of the wafer. In the active region there is formed an emitter electrode on the front side of the wafer. Thereafter the back surface of the n-type wafer is uniformly ground for reducing the thickness of the n-type wafer.

From US 2014/0361312 A1 there is known a method for manufacturing a power semiconductor device including the steps of providing a p-type SiC substrate wafer, which includes an active area and an edge termination area surrounding the active area, forming a BSPG layer in the edge termination area on a front side of the wafer, forming a source electrode in the active area on the front side of the substrate wafer and performing back grinding to reduce the time required for a trench etching process for the rear surface of the substrate wafer.

From WO 2015/025625 A1 there is known silicon carbide semiconductor device and a manufacturing method for the same, in which a silicon carbide semiconductor substrate comprising a first main surface and a second main surface, is prepared. A first electrode, which is in contact with the first main surface of the silicon carbide semiconductor substrate and which is ohmically connected to the silicon carbide semiconductor substrate, is formed. At least a portion of the second main surface side of the silicon carbide semiconductor substrate is removed. A second electrode, which is in contact with the second main surface of the silicon carbide semiconductor substrate that has been exposed by the removal of the at least a portion of the silicon carbide semiconductor substrate, and which is ohmically connected to the silicon carbide semiconductor substrate, is formed. A metal layer which is in electrical contact with a fourth main surface of the second electrode is formed. The thickness of the metal layer is greater than the thickness of the silicon carbide semiconductor substrate subsequent to the removal of the at least a portion of the silicon carbide semiconductor substrate. As a result, a silicon carbide semiconductor device in which ON-resistance can be reduced, and a manufacturing method for the same, are provided.

From US 2005/233499 A1 there is known a manufacturing method for an IGBT, wherein the method comprises a step of providing a n-type semiconductor wafer, a step of forming an emitter electrode in an element formation region, a step of forming a polyimide resin film as an uppermost layer film on the surface side of the semiconductor wafer in an element isolation region and in the element formation region, and a back grinding step using a chuck table and a grinding wheel.

From JP 2003-249654 A it is known to provide a semiconductor device having constitution of an IGBT wherein switching characteristic when turning off is improved by using a simple structure and a method, and to provide its manufacturing method. Recessed surfaces are formed by grinding on one main surface of a semiconductor device on which surface an N+ buffer layer is formed.

There are known vertical power semiconductor devices such as the insulated gate bipolar transistor (IGBT) and different kind of power diodes, power metal oxide semiconductor field effect transistors (MOSFET) and bi-mode insulated gate transistors (BiGT), which have in common that in on-state of the device a current is flowing through a wafer in a vertical direction perpendicular to a wafer main side. In such power semiconductor device it is desired to have an on-state voltage as low as possible while maintaining a high blocking capability.

From EP 2 747 142 A1 it is known an IGBT and a manufacturing method for such IGBT. Therein, it is described to optimize the design of the termination area and to introduce an additional channel stopper area surrounding the termination area to optimize the blocking capability and the ruggedness of the IGBT.

A high blocking capability requires a relatively thick wafer. However, with increasing thickness of the wafer, the on-state voltage and losses are increasing. Therefore, to minimize the losses, the wafer of the device should not be thicker than the minimum thickness which is necessary to achieve a desired blocking capability. Reducing the thickness of the wafer also reduces the parasitic capacitances associated with the device. This reduces the drive requirements and speeds up the switching speeds.

For handling reasons the currently used wafers must have a minimum thickness well above 200 $\mu m$ that prevents mechanical breakage during the production process. However, this minimum thickness would eliminate the required device performance in terms of losses for low voltage (<1.7 kV) devices. Hence a grinding step is introduced at the end of the production sequence to thin down the wafer to approximately 120 $\mu m$ to 180 $\mu m$ (depending on the voltage class) and to optimize for losses while maintaining the minimum thickness of the wafer to obtain the desired blocking capability.

A known grinding process for thinning a wafer 1 of an insulated gate bipolar transistor (IGBT) is illustrated in FIGS. 1 to 3. The wafer 1 has a first main side 2 (which is the front side of the wafer 1) and a second main side 3 opposite to the first main side 2. In FIG. 1 there is shown the wafer 1 with a processed front side in cross-section before the grinding step. The wafer 1 includes an active cell area 4 in a central part of the wafer 1 and a termination area 5 surrounding the active cell area 4 in an orthogonal projection onto a plane parallel to the first main side 2. A first electrode implemented as a metallization layer 6 is arranged on the first main side 2 of the wafer 1 in the active cell area 4. Therein, the metallization layer 6 is electrically connected to the wafer 1. In the termination area 5 there are formed guard rings 7 surrounding the active cell area 4. On the first main side 2 of the wafer 1, in the termination area 5, there are formed a passivation layer 9 and individual field plates 8 or metal plugs, which are electrically connected to the guard rings 7 through openings in a lower portion of the passivation layer 9. On top of the field plates 8 and the passivation layer 9 there is formed a thick polyimide passivation layer 17 arranged on the first main side 2 of the wafer 1 to cover the whole termination area 5. On the front side of the device which is the first main side 2 of the wafer 1, there are formed a plurality of cells in the active cell area 4. In case of an IGBT each cell includes a p-type base layer region 24 and an n-type emitter layer region 23 within the base layer region 24 to be separated from the remaining regions of the wafer 1 wherein the metallization layer 6 is electrically connected to the emitter layer region 23 and the base layer region 24. The base layer region 24 is separated from the relatively low doped bulk material of the wafer 1, which forms the drift layer in the final device, by an n-type enhancement layer 25 surrounding the base layer region 24 and having a higher doping concentration than the bulk material of the wafer 1. Further, there are formed a plurality of insulated gate electrodes adjacent to the first main side 2, each of which comprises an electrically conductive gate layer 21 and a first insulating layer 26 and second insulating layer 22, wherein the gate layer 21 is separated from any one of the layers in the wafer 1 by the first insulating layer 26 and from the metallization layer 6 by the second insulating layer 22.

For the grinding process, a foil 30 is laminated onto the front side topology of the device. The device is then mounted onto a chuck 31 and the wafer 1 is thinned from its second main side 3 by grinding while being pressed onto a grinding wheel 32 by the chuck 31 as shown in FIG. 2. The analysis on grinded wafers 1' yielded thickness variations Ad exceeding 4 $\mu m$. The wafer 1' is thinned the most in the termination area 5 while in contrast the active cell area 4 is thicker by roughly Ad=4 $\mu m$.

However, when the wafer 1' is thinned down to a certain thickness to obtain a certain on-state voltage, the blocking capability is decreased and also the ruggedness of the device is impaired. In general it is desired to provide a power semiconductor device which has a low on-state voltage and a high blocking capability as well as a good ruggedness.

The inventors found out that in the prior art an inhomogeneous removal of silicon during the grinding step is caused by transfer of the front-side topology of the wafer to the backside during the grinding step. Especially a height difference between the metallization layer 6 in the active cell area 4 and the polyimide passivation layer 17 in the termination area 5 results in an inhomogeneous thickness of the wafer 1' after grinding as shown in FIG. 3.

SUMMARY OF THE INVENTION

It is the object of the invention to provide a method for manufacturing a power semiconductor device, which is optimized with regard to the blocking capability and with regard to the on-state voltage, i.e. which can produce a power semiconductor device which has a blocking capability as high as possible and which has an on-state voltage as low as possible.

The object is attained by a method for manufacturing a power semiconductor device according to claim 1. In the method of the invention according to claim 1, the metallization layer in the active cell area is thick enough to ensure that during the grinding step the thickness of the wafer in the termination area is not significantly reduced relative to the thickness of the wafer in the active cell area. Surprisingly, the blocking capability could be improved drastically in this way.

In the method of the invention according to claim 1, the step of forming the metallization layer comprises a first step of forming a lower portion of the metallization layer on the first main side in the active cell area before the step of forming the isolation layer and a second step of forming an upper portion of the metallization layer on the lower portion of the metallization layer in the active cell area after the step of forming the isolation layer. By providing the additional second step it is possible to adjust the height difference between the top surface of the isolation layer and the top surface of the metallization layer in the active cell area independently from the thickness of the isolation layer.

In the prior art methods, the isolation layer overlaps with the metallization layer so that the isolation layer extends above the metallization layer by its thickness, which leads to the already mentioned problems of such regions, in which the isolation layer projects the metallization layer, being more thinned than such regions, which have extend to a lower plane. By splitting the metallization creation process into two steps, one being performed before the isolation layer creation and one being performed afterwards, it is possible to create a metallization layer, which projects the isolation layer, so that a uniform thinning may be performed in the central area in the thinning step, resulting in a wafer which has a thickness in the termination area, which is at least as thick as in the central area (if the metallization layer extends above the isolation layer the wafer may be thickener in the termination area).

Further developments of the invention are specified in the dependent claims.

In an exemplary embodiment a distance between the first plane and the second plane, i.e. a height difference between the top surface of the isolation layer in the termination area and the top surface of the metallization layer in the active cell area is less than 1 $\mu m$. In this exemplary embodiment the wafer thickness of the final device can be ensured to be very homogeneous throughout the wafer.

In another exemplary embodiment the first plane is further away from the wafer than the second plane and a distance between the first plane and the second plane is 1 $\mu m$ or more, i.e. the top surface of the metallization layer is at least 1 $\mu m$ higher than that of the isolation layer in the termination area. In this exemplary embodiment, the wafer thickness in the final device is significantly higher in the active cell area than in the termination area. In this way the blocking capability and ruggedness can be optimized without sacrificing a low on-state voltage.

In an exemplary embodiment the thickness of the isolation layer in a direction perpendicular to the first main side is 5 $\mu m$ or more. In this exemplary embodiment, the power semiconductor device is improved with regard to blocking capability and ruggedness. With a thickness of the isolation layer of 5 $\mu m$ or more, the influence of contamination with metal particles on the isolation layer on the electric field distribution inside of the device can reliable be attenuated sufficiently to prevent negative impact of such metal particles on the blocking capability or reliability. Accordingly, electrical breakdown due to peaks in the electric field caused by metal particles can be avoided and a high blocking capability can be ensured even in case of metal particles on the isolation layer.

In an exemplary embodiment the isolation layer is formed of polyimide. This material is mechanically stable, heat resistant and has good electrical isolation properties.

In an exemplary embodiment, the power semiconductor device is an isolated gate bipolar transistor.

BRIEF DESCRIPTION OF THE DRAWINGS

Detailed embodiments of the invention will be explained below with reference to the accompanying figures, in which:

FIG. 1 shows a processed wafer in cross section during a known manufacturing method for a power semiconductor device in a state after finishing the processing of the front side of the wafer;

FIG. 2 shows the processed wafer of FIG. 1 in cross section after being mounted to a grinding machine in the known manufacturing method;

FIG. 3 shows the processed wafer of FIG. 1 in cross section after a step of thinning in the grinding machine shown in FIG. 2 in the known manufacturing method;

FIG. 4 shows a processed wafer in cross section in a method for manufacturing a power semiconductor device according to a first embodiment of the invention in a state after finishing the processing of the front side of the wafer;

FIG. 5 shows the processed wafer of FIG. 4 after being mounted to a grinding machine in the method according to the first embodiment;

FIG. 6 shows the processed wafer of FIG. 4 after a step of thinning in the grinding machine shown in FIG. 5 in the method according to the first embodiment;

FIG. 9 shows the processed wafer of FIG. 8 after a step of thinning in the method according to the second embodiment;

FIG. 10 is a cross sectional view of the power semiconductor device manufactured by a method according to a third embodiment; and FIG. 11 is a cross sectional view of the power semiconductor device manufactured by the method according to the fourth embodiment.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 7:
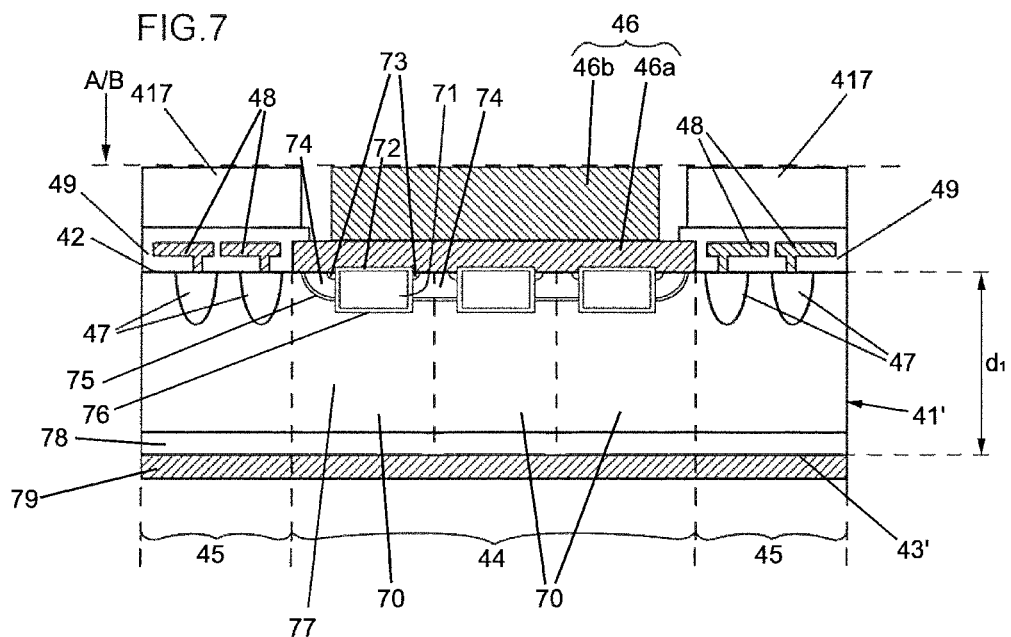
FIG. 7 is a cross sectional view of the power semiconductor device manufactured by the method according to the first embodiment.

In the following a power semiconductor device according to a first embodiment of the invention is described with FIG. 7. The power semiconductor device of the first embodiment is an insulated gate bipolar transistor (IGBT). It comprises a (thinned) silicon wafer 41' having a first main side 42 (corresponding to the front side of the IGBT) and a second main side 43' (corresponding to the backside of the IGBT) opposite to the first main side 42. The wafer 41' includes an active cell area 44, which extends from the first main side 42 to the second main side 43', in a central part of the wafer 41' and a termination area 45 surrounding the active cell area 44 in an orthogonal projection onto a plane parallel to the first main side 42. In a direction perpendicular to the first main side 42 the wafer 41' has exemplarily a thickness di of 180 $\mu m$ or less.

In the active cell area 44 there are formed a plurality of cells 70. As shown in FIG. 7, each cell 70 comprises between the first main side 42 and the second main side 43' in the following order: an n-type emitter layer region 73, optionally, a highly doped p-type contact layer (not shown in the Figures), a p-type base layer region 74, an n-type enhancement layer 75, an n-type drift layer 77, and a p-type collector layer 78. Both the base layer region 74 and the emitter layer region 73 are arranged adjacent to the first main side 42. The enhancement layer 75 extends to a first depth from the first main side 42. The base layer region 74 extends from the first main side 42 to a second depth, which is the extension of the base layer region 74 in a direction vertical to the first main side 42 from the first main side 42 towards the second main side 43'. The emitter layer region 73 extends from the first main side 42 to a third depth, which is the extension of the emitter layer region 73 in the direction vertical to the first main side 42 from the first main side 42 towards the second main side 43'. The first depth is greater than the second depth, and the second depth is greater than the third depth.

The emitter layer region 73 is formed within the base layer region 74 to be separated from the remaining n-type regions of the wafer 41' by the base layer region 74. The base layer region 74 is separated from the relatively low doped n-type drift layer 77 by the relatively higher doped n-type enhancement layer 75 surrounding the base layer region 74. Adjacent to the second main side 43' of the wafer 41' there is formed the continuous p-type collector layer 78. The collector layer 78 is separated from the base layer region 74 and the enhancement layer 75 by the drift layer 77.

The choice of the doping concentration and thicknesses of the drift layer 77 depends on the blocking capability requirements. The low-doped drift layer 77 is the main region for supporting the blocking voltage on the main PN junction emitter side. The drift layer 77 is a constantly low doped n-type layer. Exemplary, the thickness of a drift layer for a 600 V device is 30 to 70 $\mu m$, 80 to 140 $\mu m$ for a 1200 V device and 150 to 210 $\mu m$ for a 1700 V device. The doping concentration for a lower voltage device is exemplarily higher than for a higher voltage device, e.g. around $1.5 \cdot 10^{14}$ $cm^{-3}$ for a 600 V device down to $5 \cdot 10^{13}$ $cm^{-3}$ for a 1700 V device. However, the concrete values for a device may vary depending on its application. The enhancement layer 75 has a doping concentration which is higher than that of the drift layer 77. Exemplarily, the doping concentration of the enhancement layer 75 increases steadily towards the first main side 42 up to a maximum concentration between $5 \cdot 10^{15}$ $cm^{-3}$ and $5 \cdot 10^{17}$ $cm^{-3}$.

Each cell 70 comprises an insulated trench gate electrode adjacent to the first main side 42. The insulated trench gate electrode includes an electrically conductive gate layer 71, a first insulating layer 76 and a second insulating layer 72. Exemplarily, the conductive gate layer 71 is made of heavily doped polysilicon or a metal like aluminium. Also exemplarily, the first insulating layer 76 and the second insulating layer 72 are formed of silicon dioxide. The conductive gate layer 71 is separated and electrically insulated from the various layers in the wafer 41', namely from the emitter layer region 73, the base layer region 74, the enhancement layer 75 and the drift layer 77 by the first insulating layer 76. The second insulating layer 72 is electrically insulating and separating the gate layer 71 from an emitter electrode implemented as a metallization layer 46 formed on the first main side 42 to electrically contact the base layer region 74 and the emitter layer region 73 of each cell 70. A surface of the metallization layer 46 facing away from the wafer 41 defines a first plane B parallel to the first main side 42. Throughout the specifications a plane defined by a surface facing away from the wafer means the plane which includes that portions of the surface facing away from the wafer, which have the maximum distance from the wafer. Such portion can be an area or a line. In the present embodiment as shown in FIGS. 1 to 7, the whole surface of the metallization layer 46 facing away from the wafer 41 is included in the first plane B. However, in case that the surface of the metallization layer 46 facing away from the wafer 41 would have areas with different distances from the wafer 41 then only the areas having the maximum distance from the wafer would be included in the first plane B.

On the second main side 43' there is arranged a collector electrode 79, which is in electrical contact with the collector layer 78.

In the termination area 45 there is arranged at least one p-type guard ring 47 adjacent to the first main side 42, wherein the guard ring 47 is surrounding the active cell area 44 in a planar projection onto a plane parallel to the first main side 42. At the guard ring 47 the electrical field during operation of the IGBT in blocking mode is reduced. At least one field plate 48 and a passivation layer 49 are arranged on the first main side 42 of the wafer 41' in the termination area 45. Therein, the at least one field plate 48 is electrically connected with the at least one guard ring 47 as shown in FIG. 7. On top of the at least one field plate 48 and the passivation layer 49 the whole termination area 45 is covered by an isolation layer 417 formed of polyimide. The isolation layer 417 has a layer thickness in a direction perpendicular to the first main side 42 of the wafer 41 which is 7 $\mu m$ or more, exemplarily 10 $\mu m$ or more. A surface of the isolation layer 417 facing away from the wafer 41' defines a second plane A parallel to the first plane B.

In the IGBT of the first embodiment shown in FIG. 7 a distance between the first plane B and the second plane A is less than 1 $\mu m$. As can be seen later this specific arrangement of the metallization layer 46 and of the isolation layer 417 allows for a manufacturing method of the IGBT with a wafer grinding step (for thinning of the wafer) after forming of the front side topology (including the metallization layer 46 and the isolation layer 417) resulting in a minimum variation of the wafer thickness di throughout the (thinned wafer) 41'. That means that the wafer 41' can be thinned down during its manufacturing process more uniformly in the active cell area 44 and in the termination area 45 than in the prior art discussed with FIGS. 1 to 3.

A method for manufacturing the IGBT as described above with reference to FIG. 7 is described in the following with reference to FIGS. 4 to 7. In the method of the first embodiment, first a n-type silicon wafer 41 having the first main side 42 (which corresponds to the front side of the final device as shown in FIG. 7) and a second main side 43 is provided. The wafer 41 includes the active cell area 44, which extends from the first main side 42 to the second main side 43, in a central part of the wafer 41 and the termination area 45 surrounding the active cell area 44 in an orthogonal projection onto a plane parallel to the first main side 42. In a direction perpendicular to the first main side 42 the wafer has a thickness do which is larger than the thickness di in the final device as shown in FIG. 7.

Next the wafer 41 is processed on its first main side 42 to form a front side topology as shown in FIG. 4, which shows the processed wafer 42 in cross section in a plane perpendicular to the first main side 42.

Forming the front side topology also includes forming the at least one guard ring 47 in the termination area 45. The at least one guard ring 47 is formed by forming a mask, e.g. an oxide mask, on the first main side 42 of the wafer 41 with openings in the termination area 45, so that a p-type first dopant, e.g. boron ions, can be supplied selectively to areas in the termination area 45.

Then, an n-type first dopant, e.g. phosphorous, is selectively supplied to the first main side 42 using a first mask (not shown in the Figures), which covers at least the termination area 45, so that the first dopant is selectively supplied to the active cell area 44 from the first main side 42 for forming of the first enhancement layer 75. No first dopant is supplied to the termination area 45 due to the first mask. The first dopant is supplied into the wafer up to a first depth from the first main side 42.

Then a p-type second dopant, e.g. boron, is supplied to the first main side 42 through the first mask, so that the second dopant is supplied selectively into the active cell area 44 from the first main side 42 for forming of the base layer regions 74. The second dopant is supplied into the wafer 41 up to a second depth from the first main side 42, the second depth being less than the first depth. Therefore, each base layer region 74 is surrounded by the enhancement layer 75, so that the base layer region 74 is separated from the drift layer 77 formed by the bulk material of the wafer 41 by the enhancement layer 75.

Another p-type dopant may be supplied into the active cell area 44 through the first mask to a lower depth than the second dopant in order to form a p-type contact layer (not shown in the Figures), which has a higher maximum doping concentration than the base layer regions 74 for facilitating the formation of a low resistivity electrical contact to the base layer regions 74.

Afterwards, an n-type third dopant, e.g. arsenic, is selectively supplied to the active cell area 44 through a second mask (not shown in the Figures) on the first main side 42. Therein, the second mask comprises at least the first mask. The third dopant is supplied into the wafer 41 up to a third depth from the first main side 42, wherein the third depth is less than the second depth. The third dopant is incorporated into the active cell area 44 for forming the emitter layer regions 73 adjacent to the first main side 42, wherein the emitter layer regions 73 are separated from the enhancement layer 75 by the base layer regions 74.

The formation of the front side topology comprises also process steps for forming the insulated trench gate electrodes, each insulated trench gate electrode extending from the first main side 42 through a corresponding base layer region 74 to the drift layer 77. Each insulated trench gate electrode includes an electrically conductive gate layer 71, a first insulating layer 76 and second insulating layer 72, wherein the gate layer 71 is separated from any one of the layers in the wafer 41 by the first insulating layer 76. The second insulating layer 72 is formed on top of the gate layer 71 for electrically insulating it from a metallization layer 46 formed on the first main side 42 in a later process step for forming the emitter electrode implemented as the metallization layer 46. Exemplarily the first insulating layer 76 and the second insulating layer 72 are formed of silicon dioxide.

For forming the various layers, the dopants may exemplarily be supplied into the wafer 42 by ion implantation or diffusion of the dopants from a solid, liquid or gas source. Subsequent to the ion implantation or diffusion of the dopants from the solid, liquid or gas source, the dopants may be further diffused in the wafer for forming the various layers in the final device by a heat treatment.

After the various layers in the wafer 41 and the insulated trench gate electrodes are formed, a lower portion of a passivation layer 49 is formed selectively on the first main side 42 in the termination area 45. Then, a lower portion 46a of the metallization layer 46 is formed on the first main side 42 to electrically contact the wafer 41 in the active cell area 44. At the same time, i.e. in the same process step, or in a separate process step before or after the process step for forming the lower portion 46a of the metallization layer 46, the at least one individual field plate 48 is formed on the first main side 42 of the wafer 41 in the termination area 45, the at least one field plate 48 electrically contacting the at least one guard ring 47 through an opening in the lower portion of the passivation layer 49 formed before. In case that the field plate 48 is formed in the same process step as the lower portion 46a it is considered to form a part of the lower portion 46a, i.e. in this case the lower portion 46a of the metallization layer is formed not only in the active cell area 44 but also in the termination area 45, wherein the field plates 48 are individual portions which are not connected to the remaining parts of the metallization layer 46. After forming the field plates 48 an upper portion of the passivation layer 49 is formed to cover the field plates 48 as shown in FIG. 4. The upper portion of the passivation layer 49 may extend onto the lower portion 46a of the metallization layer 46 to overlap with the lower portion 46a of the metallization layer in an orthogonal projection onto a plane parallel to the first main side 42.

On top of the field plates 48 and on top of the passivation layer 49 the isolation layer 417 made of polyimide is formed to cover the whole termination area 45. In an orthogonal projection onto a plane parallel to the first main side the isolation layer 417 may overlap with the lower portion 46a of the metallization layer 46. The isolation layer 417 has a layer thickness in a direction perpendicular to the first main side 42 of the wafer 41 which is 5 $\mu m$ or more, exemplarily 7 $\mu m$ or more, and further exemplarily 10 $\mu m$ or more. The upper surface of the isolation layer 417, which is the surface of the isolation layer 417 facing away from the wafer 41 defines the second plane A parallel to the first main side 42 of the wafer 41.

Before or after the isolation layer 417 is formed, but before thinning the wafer 41 on the second main side 43, an upper portion 46b of the metallization layer 46 is selectively formed on the lower portion 46a of the metallization layer 46 only in the active cell area 44. Exemplarily the upper portion 46b of the metallization layer 46 is selectively formed by physical vapour deposition of a metal using a shadow mask covering the termination area 45.

The upper portion 46b of the metallization layer 46 can also selectively be formed by a lift-off process. An inverse pattern is first created in a sacrificial layer (exemplarily a photoresist, not shown in the Figures) deposited on the front side surface of the processed wafer 41'. This is done by etching openings through the sacrificial layer so that the metal can reach the surface of the lower portion 46a of the metallization layer 46 in the active cell area 44, where the final pattern is to be created. A metal layer is then deposited over the whole area of the wafer 41, reaching the upper surface of the lower portion 46a of the metallization layer 46 in the etched regions and staying on top of the sacrificial layer in the regions, where it was not previously etched. When the sacrificial layer is washed away (e.g. the photoresist in a solvent), the metal on top of the sacrificial layer is lifted-off and washed away together with the sacrificial layer below. After the lift-off, the metal layer remains only in the regions where it was not deposited on top of the sacrificial layer, i.e. only in the active cell area 44. Thus the upper portion 46b of the metallization layer 46 can be formed selectively only in the active cell area 44 on top of the lower portion 46a of the metallization layer 46.

Another process for forming the upper portion 46b of the metallization layer 46 on top of the lower portion 46a selectively only in the active cell area is electroless plating.

The upper surface of the metallization layer 46, i.e. the surface which faces away from the wafer 41, defines the first plane B parallel to the first main side. In the first embodiment the planes A and B are substantially identical as shown in FIG. 4 or have a distance of less than 1 $\mu m$. Accordingly, the first plane B is further away from the wafer 41 than a third plane, which is parallel to the second plane A and arranged at a distance of 1 $\mu m$ from the second plane A in a direction towards the wafer 41, which shall mean that the second plane A (isolation layer 417) is at most 1 $\mu m$ further away from the wafer 41 than the first plane B; B' (metallization layer 46). By having such a small thickness difference at the thinning process or by having the first plane B; B' further away from the wafer 41 than plane A of the isolation layer 417, it is ensured that the wafer is thinned to a homogeneous thickness in the central part on the second main side 43 (i.e. such part, in which on the opposite first main side the metallization layer 46 is arranged). If planes A and B; B' are about in one plane (i.e. vary by at most 1 $\mu m$) the thickness is thinned also in the termination area to the same thickness as in the central area. For the case that the first plane B B' is farer away from the wafer 41 than the second plane A, the thickness of the wafer 41 may be reduced more in the central area than in the termination area due to the central area being pressed by the chuck 421 to the grinding wheel 422, whereas in the termination area due to the isolation layer 417 being arranged in a lower plane the wafer 41 may bend during the thinning process towards the first main side so that a higher thickness is maintained during thinning, resulting in a thicker wafer in the termination area.

In other exemplary embodiments, the first plane B; B' and the second plane A are arranged at the same distance from the wafer 41. Exemplarily, the first plane may be arranged further away from the wafer 41 than the second plane A.

In a next step a foil 420 is laminated onto the processed device wafer 41 for protecting the front side topology during subsequent process steps. The processed device wafer 41 with the foil 420 laminated on its front side (corresponding to the first main side 42 of the wafer 41) is mounted to a flat surface of a chuck 421 as shown in FIG. 5. The processed wafer 41 mounted to the chuck 421 is then pressed onto a grinding wheel 422 with its second main side by applying a pressure between the chuck 421 and the grinding wheel 422. By applying the pressure between the chuck 421 and the grinding wheel 422 while moving, exemplarily rotating, the chuck 421 together with the processed wafer 41 relative to the grinding wheel 422 (or vice versa moving, exemplarily rotating, the grinding wheel 422 relative to the chuck 421), the wafer is thinned by being grinded from its original thickness do shown in FIGS. 4 and 5 down to a smaller thickness di as shown in FIG. 6.

Afterwards, on the second main side 43' of the thinned wafer 41', the p-type collector layer 78 is formed by supplying a p-type dopant into the wafer 41' from its second main side 43', and afterwards the collector electrode 79 is formed on the second main side 43' to electrically contact the p-type collector layer 78. In this manner the final power semiconductor device as shown in FIG. 7 is manufactured.

Figure 8:
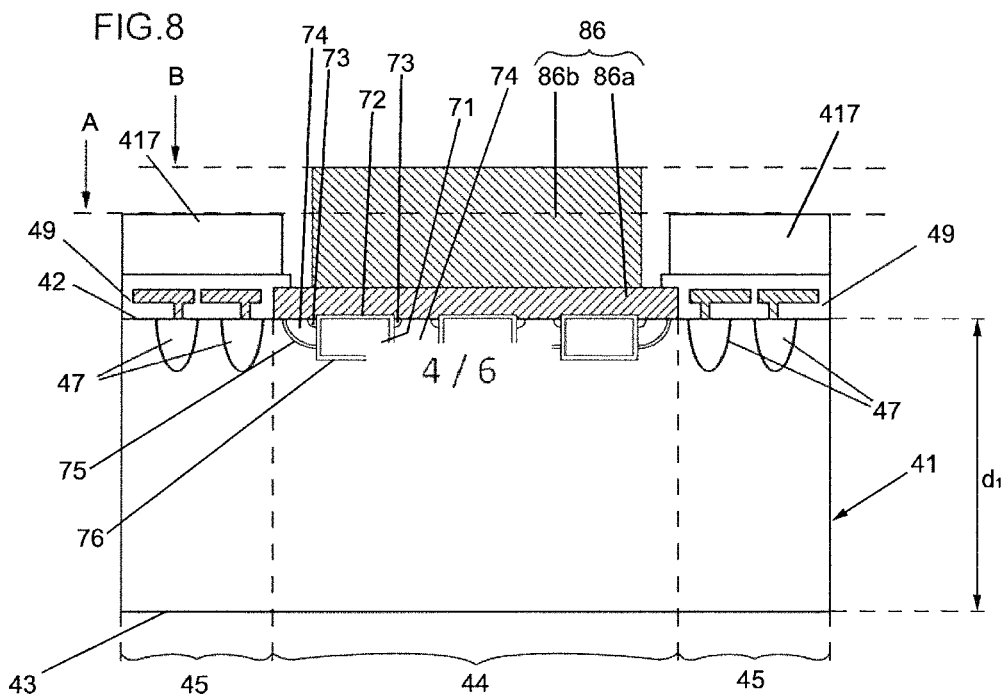
FIG. 8 shows a processed wafer in cross section in a method for manufacturing a power semiconductor device according to a second embodiment of the invention in a state after finishing the processing of the front side of the wafer.

Next a second embodiment of the invention is described with FIGS. 8 and 9. Due to many similarities with the first embodiment only the differences between the first and the second embodiment are described. If the same reference signs are used for elements in the first and second embodiment, these elements shall have same features.

In the power semiconductor device according to the second embodiment the metallization layer 86 corresponds to the metallization layer 46 in the first embodiment. Accordingly, the lower portion 86a and the upper portion 86b in the second embodiment correspond to the lower portion 46a and the upper portion 46b in the first embodiment. The metallization layer 86 in the second embodiment differs from the metallization layer 46 in the first embodiment only in that the first plane B' defined by the upper surface of the metallization layer 86 is intentionally shifted from the second plane A defined by the upper surface of the isolation layer 417 by a distance of 1 $\mu m$ or more, exemplarily 2 $\mu m$ or more, to intentionally generate, in the grinding step, a difference of Ado between the thickness of the wafer 41" in the termination area 45 and the thickness of the wafer 41" in the active cell area 44 with a thickness $d_2$ in the termination area 45 being higher than the thickness in the active cell area 44. Therein the difference Ado between the thickness of the wafer 41" in the termination area 45 and the thickness of the wafer 41" in the active cell area 44 is caused by transfer of the front-side topology of the wafer to the backside during the grinding step for thinning the wafer 41". As in the first embodiment, the first plane B' is further away from the wafer 41" than the third plane, which is parallel to the second plane A and arranged at a distance of 1 $\mu m$ from the second plane A in a direction towards the wafer 41". Compared to the first embodiment, in the second embodiment the blocking capability of the IGBT can be further increased while maintaining a specific on-state voltage, or the on-state voltage can be decreased while maintaining a specific blocking capability.

The method for manufacturing the power semiconductor device according to the second embodiment differs from the method for manufacturing the power semiconductor device according to the first embodiment in that the upper portion 86b is formed with a higher thickness in a direction vertical to the first main side 42 compared to a thickness of the upper portion 46b in the first embodiment, and/or that the isolation layer 417 is formed with a lower thickness compared to the isolation layer 417 in the first embodiment.

In FIG. 10 there is shown a power semiconductor device according to a third embodiment. Due to many similarities with the first embodiment only the differences between the first and the third embodiment are described. If in the Figures the same reference signs are used for elements in the first and third embodiment, these elements shall have the same features (the same applies for the embodiment shown in FIG. 11).

The power semiconductor device according to the first embodiment as shown in FIG. 7 is a trench IGBT with insulated trench gate electrodes. In contrast thereto, the power semiconductor device according to the third embodiment as shown in FIG. 10 is a planar IGBT with a plurality of insulated planar gate electrodes. Each insulated planar gate electrode comprises a conductive gate layer 81, a first insulating layer 88 and a second insulating layer 82. Like the IGBT according to the first embodiment as shown in FIG. 7, the IGBT according to the third embodiment as shown in FIG. 10 comprises a thinned wafer 41' having a termination area 45 and an active cell area 44 similar to the first embodiment. In the active cell area 44 there is formed a plurality of cells 80. Each cell 80 comprises in the order from first main side 42 to the second main side 43' of the thinned wafer 4 an n-type emitter layer region 83, optionally, a highly doped p-type contact layer (not shown in the Figures), a p-type base layer region 84, an n-type enhancement layer 85, an n-type drift layer 77, and a p-type collector layer 78. The n-type emitter layer region 83 corresponds to the n-type emitter layer region 73, the p-type base layer region 84 corresponds to the p-type base layer region 74, and the n-type enhancement layer 85 corresponds to the n-type enhancement layer 75. Therefore, it is referred to the description of the first embodiment with regard to these elements.

In the first and second embodiment, the whole surface of the isolation layer 417 facing away from the wafer 41 was included in the second plane A defined by this surface. However, in the present embodiment as shown in FIG. 10, only a portion of the surface of the isolation layer 417 facing away from the wafer 41', namely the portion having the maximum distance from the wafer 41', is included in the second plane A.

In the third embodiment, the first insulating layer 88 is arranged on the first main side 42, electrically insulating the gate layer 81 from any of the various layers in the wafer 41 (i.e. from emitter layer regions 83, from the base layer regions 84, from the enhancement layer 85 and from the drift layer 77). The second insulating layer 82 covers the electrically conductive layer 81 and, thus, electrically insulates the gate layer 81 from the emitter electrode implemented as the metallization layer 46. Therefore, in between the first insulating layer 88 and the second insulating layer 82, which are exemplarily made of silicon dioxide, the electrically conductive gate layer 81 is embedded. Like the gate layer 71, also the electrically conductive gate layer 81 is exemplarily made of a heavily doped polysilicon or a metal like aluminium. All other features of the third embodiment are the same as the features of the first embodiment.

In the fourth embodiment, shown in FIG. 11, the device has been manufactured according to the method disclosed for FIG. 9. Additionally shown in this figure are a buffer layer 770, which is an optional, n doped layer, wherein the doping concentration is higher than of the drift layer 77. On the buffer layer, a p doped collector layer 78 is arranged, which is contacted by a collector electrode 79.

The method for manufacturing a power semiconductor according to the third embodiment differs from the method for manufacturing the power semiconductor device according to the first embodiment only in the process steps for forming the insulated planar gate electrodes (which differ from the process steps for forming the insulated trench gate electrodes in the first embodiment).

It will be apparent for persons skilled in the art that modifications of the above described embodiment are possible without departing from the idea of the invention as defined by the appended claims.

In the above embodiments the power semiconductor device was described to be an IGBT with the enhancement layer 75, 85. However, the enhancement layer 75, 85 is optional. In a modified first to third embodiment, the IGBT has no enhancement layer 75, 85. Accordingly, the corresponding methods for manufacturing a power semiconductor device may not include the steps for forming the enhancement layer 75, 85.

In the above embodiments of a method for manufacturing a power semiconductor device, the collector layer 78 was described to be formed after the grinding step on the second main side 43 by supplying a p-type dopant into the thinned wafer 41' from its second main side 43'. However, it is also possible to form a thick p-type layer in the wafer 41 by supplying a p-type dopant into the wafer 41' from its second main side 43 before the grinding step, i.e. before thinning the wafer 41, and to form the collector layer 78 from such thick p-type layer by removing part of this thick p-type layer in the grinding step.

In the above embodiments at least one guard ring 48 was described. However, instead of the at least one guard ring any other termination layer, such as a spirally wound ring, a variation-in-lateral-doping (VLD) layer having a doping concentration which is gradually decreasing with increasing distance from the active cell area in a lateral direction or only an electrically conductive field plate may be used as a termination structure in the termination area.

In the above described embodiments the wafer 41 is described to be a silicon wafer. However, the wafer 41 may be a wafer made of any other semiconductor material, such as silicon carbide (SiC), a group-III-nitride material, such as aluminium nitride (AlN), aluminium gallium nitride (Al-GaN), or any other semiconductor material appropriate for a power semiconductor device. Furthermore, the wafer may have any shape (in projection onto a plane parallel to the first main side 42), such as a circular shape, rectangular shape or any other shape.

In the above described embodiments a wafer with one active cell area 44 surrounded by a single continuous termination area 45 was described. However, it is also possible that one wafer includes a plurality of active cell areas and a plurality of termination regions, wherein each one of the active cell areas is surrounded by one of the plurality of termination regions. In this case the method for manufacturing a power semiconductor device according to the invention may comprise an additional dicing step of separating the wafer with the plurality of active cell areas into dies, wherein each die comprises an active cell area and a termination region surrounding the active cell area.

In the above described embodiments the isolation layer 417 was described to be made of polyimide. While polyimide is a preferable material for the isolation layer 417 due to its good mechanical and electrical properties it is also possible to use another electrically isolating material. Exemplarily, a thin glass layer could be bonded onto the first main side in the termination area 45.

The above described embodiments of a power semiconductor device were described without a buffer layer. As is well known to the person skilled in the art a vertical power semiconductor device having the drift layer 77 arranged directly adjacent to the collector layer 78 as in the above embodiments is a non-punch through (NPT) power semiconductor device. In such device the n-type drift layer 77 is in direct contact with the collector layer 78 without having a highly doped n-type buffer layer arranged between the collector layer 78 and the drift layer 77. The electric field in blocking condition for a NPT device is triangular and stops within the drift layer 77, so that the space charge region does not reach the collector layer 78. However, a buffer layer (not shown in the Figures) may optionally be manufactured on the second main side 43 before forming the collector layer 78 in a method for manufacturing a power semiconductor device in anyone of the above described embodiments of the invention. Accordingly, a buffer layer, which has a higher doping concentration than the drift layer 77, may be arranged directly adjacent to the drift layer 77 between the drift layer 77 and the collector layer 78 in a modified embodiment of a power semiconductor device according to the invention. A device comprising such a buffer layer (which buffer layer has higher doping concentration than the relatively low-doped drift layer, either having a higher constant doping concentration than the drift layer, or a gradually rising doping concentration, or with a steadily, continuously increasing doping concentration towards the second main side 43') is called a punch-through (PT) device. At higher blocking voltages the electric field at the border between the drift layer 77 and the buffer layer will not have reached zero. Along a short distance in the buffer layer it is then steeply decreased to zero due to the high doping concentration.

In the before described embodiments the invention, the power semiconductor device was described to be an IGBT. However, the power semiconductor device of the invention is not limited to an IGBT, but can be any kind of vertical power semiconductor device, such as a power diode or a junction barrier Schottky (JBS) diode.

The above embodiment was explained with specific conductivity types. The conductivity types of the semiconductor layers in the above described embodiments might be switched, so that all layers which were described as p-type layers would be n-type layers and all layers which were described as n-type layers would be p-type layers.

It should be noted that the term "comprising" does not exclude other elements or steps and that the indefinite article "a" or "an" does not exclude the plural. Also elements described in association with different embodiments may be combined.

LIST OF REFERENCE SIGNS

1 wafer
1' grinded wafer
2 first main side
3 second main side
4 active cell area
5 termination area
6 metallization layer
7 guard ring
8 field plate
9 passivation layer
17 polyimide passivation layer
18 cell
21 gate layer
22 second insulating layer
23 emitter layer region
24 base layer region
25 enhancement layer
26 first insulating layer
30 foil
31 chuck
32 grinding wheel
41 wafer
41' (thinned) wafer
41" (thinned) wafer
42 first main side
43 second main side (of wafer 41 before the grinding step)
43' second main side (of thinned wafer 41')
44 active cell area
45 termination area
46 metallization layer
46a lower portion of the metallization layer
46b upper portion of the metallization layer
47 guard ring
48 field plate
49 passivation layer
70 cell
71 gate layer
72 second insulating layer
73 emitter layer region
74 base layer region
75 enhancement layer
76 first insulating layer
77 drift layer
770 buffer layer 78 collector layer
81 gate layer
82 second insulating layer
83 emitter layer region
84 base layer region
85 enhancement layer
86 metallization layer
86a lower portion of the metallization layer
86b upper portion of the metallization layer
88 first insulating layer
417 isolation layer
420 foil
421 chuck
422 grinding wheel
A second plane
B second plane
B' second plane
$d_0$ thickness (of wafer 41 before the grinding step)
$d_1$ thickness (of thinned wafer 41')
$d_2$ thickness (of thinned wafer 41")
Δd thickness variation

The invention claimed is:

1. A method for manufacturing a power semiconductor device, the method comprising the following steps:
providing a wafer of a first conductivity type, the wafer having a first main side and a second main side opposite to the first main side, and the wafer including an active cell area, which extends from the first main side to the second main side, in a central part of the wafer and a termination area surrounding the active cell area in an orthogonal projection onto a plane parallel to the first main side;
forming a metallization layer on the first main side to electrically contact the wafer in the active cell area, wherein the surface of the metallization layer, which faces away from the wafer, defines a first plane (B; B') parallel to the first main side;
forming an isolation layer on the first main side to cover the termination area, wherein the surface of the isolation layer facing away from the wafer defines a second plane (A) parallel to the first main side;
after the step of forming the metallization layer and after the step of forming the isolation layer, mounting the wafer with its first main side to a flat surface of a chuck; and
thereafter thinning the wafer from its second main side by grinding while pressing the second main side of the wafer onto a grinding wheel by applying a pressure between the chuck and the grinding wheel,
wherein the second plane (A) is at most 1 μm further away from the wafer than the first plane (B; B'), wherein
the step of forming the metallization layer comprises:
a first step of forming a lower portion of the metallization layer on the first main side in the active cell area before the step of forming the isolation layer; and
a second step of forming an upper portion of the metallization layer on the lower portion of the metallization layer in the active cell area after the step of forming the isolation layer.

2. The method for manufacturing a power semiconductor device according to claim 1, wherein a distance between the first plane (B) and the second plane (A) is less than 1 μm.

3. The method for manufacturing a power semiconductor device according to claim 1, wherein the first plane (B') is further away from the wafer than the second plane (A) and a distance between the first plane (B') and the second plane (A) is 1 μm or more.

4. The method for manufacturing a power semiconductor device according to claim 1, wherein the thickness of the isolation layer in a direction perpendicular to the first main side is 5 μm or more.

5. The method for manufacturing a power semiconductor device according to claim 1, wherein in the first step of forming a lower portion of the metallization layer simultaneously at least one field plate is formed in the termination area.

6. The method for manufacturing a power semiconductor device according to claim 1, further comprising a step of forming at least one termination layer of a second conductivity type, which is different from the first conductivity type, in the termination area adjacent to the first main side, the termination layer surrounding the active cell area,
wherein the at least one termination layer is one of a spirally wound layer,
at least one guard ring, and
a VLD layer having a doping concentration which is gradually decreasing with increasing distance from the active cell area in a lateral direction.

7. The method for manufacturing a power semiconductor device according to claim 6, wherein each one of the at least one termination layer is electrically connected to individual portions of the metallization layer in the termination area, wherein the individual portions of the metallization layer are physically and electrically separated from any section of the metallization layer which is arranged on the active cell area.

8. The method for manufacturing a power semiconductor device according to claim 1, wherein the isolation layer is formed of polyimide.

9. The method for manufacturing a power semiconductor device according to claim 1, wherein the power semiconductor is an insulated gate bipolar transistor and the method further comprises the following steps before the step of forming the metallization layer:
a step of forming a plurality of cells in the active cell area, each cell comprising at least a base layer region of a second conductivity type different from the first conductivity type and an emitter layer region of the first conductivity type,
wherein the emitter layer region is formed in the base layer region to be separated from the remaining regions of the wafer having the first conductivity type by the base layer region,
wherein both the base layer region and the emitter layer region are arranged adjacent to the first main side, and
wherein the metallization layer is electrically connected to the emitter layer region and the base layer region; and
a step of forming plurality of gate electrodes at the first main side, each of which comprises an electrically conductive gate layer and a first insulating layer and a second insulating layer, wherein the gate layer is separated and electrically isolated from any one of the layers in the wafer by the first insulating layer and from the metallization layer by the second insulating layer.

10. The method for manufacturing a power semiconductor device according to claim 9, the method further comprising a step of forming a collector layer of the second conductivity type adjacent to the second main side before or after the step of thinning the wafer, wherein a drift layer of the first conductivity type separates each one of the base layer regions from the collector layer.

11. The method for manufacturing a power semiconductor device according to claim 2, wherein the thickness of the isolation layer in a direction perpendicular to the first main side is 5 μm or more.

12. The method for manufacturing a power semiconductor device according to claim 3, wherein the thickness of the isolation layer in a direction perpendicular to the first main side is 5 μm or more.

13. The method for manufacturing a power semiconductor device according to claim 2, wherein in the first step of forming a lower portion of the metallization layer simultaneously at least one field plate is formed in the termination area.

14. The method for manufacturing a power semiconductor device according to claim 3, wherein in the first step of forming a lower portion of the metallization layer simultaneously at least one field plate is formed in the termination area.

15. The method for manufacturing a power semiconductor device according to claim 4, wherein in the first step of forming a lower portion of the metallization layer simultaneously at least one field plate is formed in the termination area.

16. The method for manufacturing a power semiconductor device according to claim 2, further comprising a step of forming at least one termination layer of a second conductivity type, which is different from the first conductivity type, in the termination area adjacent to the first main side, the termination layer surrounding the active cell area,
    wherein the at least one termination layer is one of a
        spirally wound layer,
    at least one guard ring, and
    a VLD layer having a doping concentration which is gradually decreasing with increasing distance from the active cell area in a lateral direction.

17. The method for manufacturing a power semiconductor device according to claim 16, wherein each one of the at least one termination layer is electrically connected to individual portions of the metallization layer in the termination area, wherein the individual portions of the metallization layer are physically and electrically separated from any section of the metallization layer which is arranged on the active cell area.

18. The method for manufacturing a power semiconductor device according to claim 2, wherein the isolation layer is formed of polyimide.

19. The method for manufacturing a power semiconductor device according to claim 2, wherein the power semiconductor is an insulated gate bipolar transistor and the method further comprises the following steps before the step of forming the metallization layer:
    a step of forming a plurality of cells in the active cell area, each cell comprising at least a base layer region of a second conductivity type different from the first conductivity type and an emitter layer region of the first conductivity type,
        wherein the emitter layer region is formed in the base layer region to be separated from the remaining regions of the wafer having the first conductivity type by the base layer region,
        wherein both the base layer region and the emitter layer region are arranged adjacent to the first main side, and
        wherein the metallization layer is electrically connected to the emitter layer region and the base layer region; and
    a step of forming plurality of gate electrodes at the first main side, each of which comprises an electrically conductive gate layer and a first insulating layer and a second insulating layer, wherein the gate layer is separated and electrically isolated from any one of the layers in the wafer by the first insulating layer and from the metallization layer by the second insulating layer.

20. The method for manufacturing a power semiconductor device according to claim 3, wherein the power semiconductor is an insulated gate bipolar transistor and the method further comprises the following steps before the step of forming the metallization layer:
    a step of forming a plurality of cells in the active cell area, each cell comprising at least a base layer region of a second conductivity type different from the first conductivity type and an emitter layer region of the first conductivity type,
        wherein the emitter layer region is formed in the base layer region to be separated from the remaining regions of the wafer having the first conductivity type by the base layer region,
        wherein both the base layer region and the emitter layer region are arranged adjacent to the first main side, and
        wherein the metallization layer is electrically connected to the emitter layer region and the base layer region; and
    a step of forming plurality of gate electrodes at the first main side, each of which comprises an electrically conductive gate layer and a first insulating layer and a second insulating layer, wherein the gate layer is separated and electrically isolated from any one of the layers in the wafer by the first insulating layer and from the metallization layer by the second insulating layer.

* * * * *